US006529041B1

(12) United States Patent
Ng et al.

(10) Patent No.: US 6,529,041 B1
(45) Date of Patent: Mar. 4, 2003

(54) SYSTEM POWER CONTROL OUTPUT CIRCUIT FOR PROGRAMMABLE LOGIC DEVICES

(75) Inventors: Mark M. Ng, San Jose, CA (US); Brian D. Erickson, Soquel, CA (US); Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/816,799

(22) Filed: Mar. 23, 2001

(51) Int. Cl.[7] .............................................. H03K 19/177

(52) U.S. Cl. ............................ 326/40; 326/38; 326/39; 326/41; 326/83

(58) Field of Search ............................ 326/38, 39, 40, 326/41, 83; 327/316

(56) References Cited

U.S. PATENT DOCUMENTS

| | | | | | |
|---|---|---|---|---|---|
| 4,829,199 | A | * | 5/1989 | Prater | 326/27 |
| 5,331,220 | A | * | 7/1994 | Pierce et al. | 326/122 |
| 5,389,834 | A | * | 2/1995 | Kinugasa et al. | 326/110 |
| 5,463,326 | A | | 10/1995 | Raje | |
| 5,506,541 | A | | 4/1996 | Herndon | |
| 5,559,441 | A | | 9/1996 | Desroches | |
| 5,717,343 | A | * | 2/1998 | Kwong | 326/121 |
| 5,760,620 | A | * | 6/1998 | Doluca | 326/83 |
| 5,811,985 | A | * | 9/1998 | Trimberger et al. | 326/38 |
| 5,869,979 | A | * | 2/1999 | Bocchino | 326/38 |
| 5,949,268 | A | | 9/1999 | Miura et al. | |
| 6,087,847 | A | | 7/2000 | Mooney et al. | |
| 6,094,069 | A | | 7/2000 | Magane et al. | |
| 6,184,730 | B1 | * | 2/2001 | Kwong et al. | 327/112 |
| 6,232,814 | B1 | | 5/2001 | Douglas, III | |

FOREIGN PATENT DOCUMENTS

EP 0 978 943 A2 2/2000

OTHER PUBLICATIONS

Thaddeus J. Gabara et al.; "Digitally Adjustable Resistors in CMOS for High–Performance Applications"; 1992 IEEE Journal of Solid–State Circuits, Aug. 1992, No. 8; New York; pp. 1176–1185.

Aris Balatsos et al., "Low–Skew Clock Generator with Dynamic Impedance and Delay Matching"; 1999 IEEE International Solid–State Circuits Conference; 0–7803–5129–0/99/.

Toshiro Takahashi et al.; "110GB/s Simultaneous Bi–Directional Transceiver Logic Synchronized with a System Clock"; 1999 IEEE International Solid–State Circuits Conference; 0–7803–5129–0/99.

Sai Vishwanthaiah et al.; "Dynamic Termination Output Driver for a 600MHz Microprocessor"; 2000 IEEE International Solid–State Circuits Conference; 0–7803–5853–8/00.

* cited by examiner

*Primary Examiner*—Michael G. Lee
*Assistant Examiner*—Steven S. Paik
(74) *Attorney, Agent, or Firm*—Patrick T. Bever; Michael R. Casey; Edel M. Young

(57) ABSTRACT

A power control output circuit for a PLD that allows the PLD to selectively operate in either a low current ("normal") output mode, or a high current power control mode. In one embodiment, the power control output circuit is incorporated into a special Input/Output Blocks (PC-IOB) of the PLD. When no power control function is needed, a high current output portion of the power control output circuit is deactivated by storing an associated data value a power control configuration memory cell of the PLD, and an output driver of the PC-IOB generates low current output signals on a device I/O terminal. To perform power control functions, a portion of the PLD's programmable logic circuitry is configured to generate a power control data signal, and the high current output portion of the power control output circuit is enabled by storing a corresponding data value in the power control configuration memory cell. When the power control data signal is generated while in the high current power control mode, the high current output circuit turns on a high current transistor that generates a high current power control output signal at the device I/O terminal.

20 Claims, 4 Drawing Sheets

SYSTEM POWER CONTROL OUTPUT CIRCUIT FOR PROGRAMMABLE LOGIC DEVICES

FIELD OF THE INVENTION

This invention relates to the field of integrated circuits, and more specifically to programmable logic devices.

BACKGROUND OF THE INVENTION

Programmable Logic Devices (PLDs) are Integrated Circuits (ICs) that are user configurable and capable of implementing digital logic operations. Logic designers typically use PLDs to implement control logic in electronic systems because they are relatively easy to program, and often can be reprogrammed to update the emulated logic function. This often makes the use of PLDs less costly in comparison to custom hardwired or "application specific" integrated circuits (ASICs).

There are several types of PLDS, including Field Programmable Gate Arrays (FPGAs) and Complex Programmable Logic Devices (CPLDs). FPGAs include configurable logic blocks (CLBs) arranged in rows and columns, IOBs surrounding the CLBs, and programmable interconnect lines that extend between the rows and columns of CLBS. Each CLB includes look-up tables (LUTs) and other configurable circuitry that is programmable to implement a portion of a larger logic function. The CLBs, IOBs and interconnect lines are configured by data stored in a configuration memory of the FPGA. In contrast to the LUT-based CLBs and interconnect lines of FPGAs, CPLDs perform logic using several function blocks that are based on the well-known programmable logic array (PLA) architecture, and utilize a central interconnect matrix to transmit signals between the function blocks. Signals are transmitted into and out of the interconnect switch matrix through input/output blocks (IOBs). However, similar to FPGAs, the input/output function of the IOBs, the logic performed by the function blocks and the signal paths implemented by the interconnect switch matrix are all controlled by configuration data stored in configuration memory of the CPLD.

FIG. 1 is a split-level perspective diagram of a typical CPLD 100. To simplify the following description, CPLD 100 is functionally separated into a logic plane 110, which includes the programmable logic resources (circuits) used to implement selected logic operations, and a configuration plane 150 that includes the configuration memory circuits used to store the configuration data utilized to control the programmable logic resources of logic plane 110. Other simplifications and functional representations are utilized to facilitate the following description.

Referring to the upper portion of FIG. 1, for explanatory purposes, logic plane 110 of CPLD 100 includes features common to XC9500 family of CPLDs that are produced by Xilinx, Inc. of San Jose, Calif. In particular, CPLD 100 includes input/output (I/O) terminals 115, IOBs 120, an interconnect switch matrix 130, and several function blocks (FBs) 140 (one shown). IOBs 120 provide buffering for device input and output signals that are applied to I/O terminals 115. Input signals are passed through IOBs 120 to switch matrix 130, and selected output signals from FB 140 are fed back into switch matrix 130. Each FB 140 includes an AND array 142 that logically ANDs input signals received from switch matrix 130 to form product term (P-term) signals that are applied to any of several macrocells 145. Each macrocell 145 is programmable to generate a sum-of-products term using selected P-term signals. These sum-of-products terms are output from macrocells 145 to IOB 120 (along with optional corresponding output enable signals). Those of ordinary skill in the art generally understand these and other circuits and operations of the programmable circuitry of logic plane 110 (described above).

Referring to the lower portion of FIG. 1, configuration plane 150 generally includes a configuration circuit 160, a non-volatile memory array 170, and a volatile memory array 180. Configuration circuit 160 performs several functions associated with configuration plane 150, including configuration operations during which configuration data is transferred from non-volatile memory array 170 to volatile memory array 180. Non-volatile (e.g., flash) memory array 170 is provided to persistently store the configuration data that is transferred to volatile memory array 180 during a configuration operation typically performed at device power-up. Volatile memory array 180 includes volatile (e.g., SRAM) configuration memory cells 182 arranged in rows and columns that temporarily store configuration data (e.g., until power to CPLD 100 is terminated). During a configuration operation, configuration circuit 160 routes configuration data from non-volatile memory array 170 to corresponding configuration memory cells 182 of volatile memory array 180. During subsequent "normal" operation of CPLD 100, the configuration data stored in volatile memory array 180 is used to control associated programmable logic resources of logic plane 110 via connections 185 (indicated by dashed lines with arrows) in a manner understood by those of ordinary skill in the art, thereby causing CPLD 100 to implement the logic operation defined by the configuration data.

FIG. 2 is a simplified circuit diagram showing portions of CPLD 100 in additional detail. In particular, FIG. 2 shows a simplified representation of FB 140, IOB 120, and configuration memory array (CONF MEM ARRAY) 180.

Referring to the upper left portion of FIG. 2, the illustrated portion of FB 140 includes a portion of logic AND array (&A) 142, which is depicted as logic AND gates 143 that generate product terms (P-terms) on macrocell input lines 144, and a portion of a macrocell 145 depicted as including a logic OR gate 147, a flip-flop (FF) 148, and an output enable (OE) buffer 149. Logic OR gate 147 typically receives several P-terms from logic AND array 142, and generates a sum-of-products (SOP) term that is optionally stored in FF 148 and transmitted to an associated IOB 120. Similarly, OE buffer 149 receives an associate P-term from logic AND array 142, and transmits the P-term to IOB 120.

Referring to the upper right portion of FIG. 2, IOB 120 includes an input buffer 121, an output driver circuit 123, an output enable (OE) multiplexer 125, a slew-rate control (SRC) circuit 127, and a user-programmable ground (UPG) circuit 129. Input buffer 121 detects and buffers input signals applied to I/O terminal 115 from external devices. Output driver circuit 123 receives the sum-of-products (SOP) term transmitted from macrocell 145, an output enable (OE) signal from OE multiplexer 125, and generates an output signal on I/O terminal 115. OE multiplexer 125 has input terminals respectively connected to receive the P-term transmitted from OE buffer 149, a global OE control signal, a fixed OE enable ("1"), and a fixed OE disable ("0"). OE multiplexer 125 selectively passes one of these OE signals to the OE terminal of output driver 123 in response to data stored configuration memory array 180 (e.g., in associated configuration data cells 182-1 and 182-2). SRC circuit 127 controls the slew rate of the output signals generated by output driver 123 in accordance with configuration data stored in configuration memory array 180 (e.g., in associated configuration data cell 182-3). Finally, when a particular I/O terminal 115 is not utilized in a user's logic operations, UPG circuit 129 allows the user to selectively tie the I/O terminal 115 to ground in accordance with configuration data stored in memory cell 182-4. Other circuitry of IOB 120 and associated connections to configuration memory array 180 are omitted for brevity.

Power control (conservation) is increasingly important in many modern platforms, and particularly in battery powered devices (e.g., laptop computers and personal digital assistants). Power control is typically performed by monitoring the activity in the system, and terminating the power supply provided to idle IC devices of the system.

PLDs, such as PLD 100 (see FIGS. 1 and 2), are often used in combination with power control devices to perform power control functions in electronic systems. Typically, a portion of the programmable logic circuitry of the PLD is programmed to monitor the activity of the various devices in a system, and to generate control signals that are used to reduce or terminate the power provided to certain IC devices of the system. The power control signals generated by the PLD are transmitted to a power control device, which is a device including high current transistors that selectively apply or terminate the flow of power to selected IC devices of the system. An example of one such system is provided below.

FIG. 3 illustrates an exemplary system 200 in which PLD 100 is used in combination with a conventional power control device 210 to control the power consumed by system 200. In this example, the system includes PLD 100 (described above), a memory device (SRAM) 220-1, and a central processing unit (CPU) 220-2 that communicate using a system bus 205.

Power control device 210 (e.g., a Quad Power Supply Controller, model number SMT4004, produced by Summit Microelectronics, Inc. of Campbell, California) includes input terminals 212-IN1 and 212-IN2 that are connected to respective IOBs of PLD 100 (e.g., IOB 120 shown in FIG. 2), and also includes a first output terminal 212-OUT1 that is connected to the power (VCC) pin of SRAM 220-1, and a second output terminal 212-OUT2 that is connected to the power (VCC) pin of CPU 220-2.

Power control device 210 acts as a switch that controls the supply of power to SRAM 220-1 and CPU-220-2 in response to control signals generated by PLD 100. In particular, a portion of the programmable logic circuitry of PLD 100 is configured to implement power control logic (e.g., to recognize idle periods during which SRAM 220-1 and/or CPU 220-2 can be powered down). When such an idle period is detected, PLD 100 generates power control signals on one or both of input terminals 212-IN1 and 212-IN2.

FIG. 4 is a simplified circuit diagram showing a portion of system 200 in additional detail. In particular, FIG. 4 shows portions of PLD 100 that are connected to input terminal 212-IN2 of power control device (PCD) 210, and shows a portion of PCD 210 that is used to control CPU 220-2. Circuitry similar to that shown in FIG. 4 is also used to control SRAM 220-1 (shown in FIG. 3).

Referring to FIG. 4, a simplified output driver circuit 123 of IOB 120 includes a buffer 123-1 and a CMOS switch 123-2. The output terminal of buffer 123-2 is connected to the gate terminals of the n-channel (N) and p-channel (P) transistors of CMOS switch 123-2. An output terminal of CMOS switch 123-2 is connected to I/O terminal 115, which in turn is connected by a conductor to input terminal (pad) 212-IN2 of PCD 210. PCD 210 includes high current transistor 215, which is connected between VCC and output terminal (pad) 212-OUT2, and is sized to transmit sufficient current to power CPU 220-2. Output terminal 212-OUT2 is connected by a conductor to input terminal (pad) 225 of CPU 220-2.

During operation of system 200, FB 140 of PLD 100 monitors various signals indicating system activity, and generates a sum-of-products data signal in accordance with the implemented power control logic. During normal operation of system 200, buffer 123-1 receives a low voltage data signal from a macrocell of FB 140, and passes the low voltage data signal to CMOS switch 123-2. The low voltage data signal turns on p-channel transistor P, thereby pulling I/O terminal 115 to VCCIO. The resulting high voltage on I/O terminal 115 is transmitted to input terminal 212-IN2 of PCD 210, thereby turning on high current transistor 215, which in turn passes the resulting high (VCC) power signal to input terminal 225 of CPU 220-2. Subsequently, when the power control logic implemented by PLD 100 determines that CPU 220-2 can be powered down, tri-state buffer 123-1 receives a high voltage data signal from a macrocell of FB 140, and passes the high voltage data signal to CMOS switch 123-2. The high voltage data signal turns on n-channel transistor N, thereby pulling down I/O terminal 115 to ground. The resulting low voltage on I/O terminal 115 is transmitted to input terminal 212-IN2 of PCD 210, thereby turning off high current transistor 215, which in turn terminates the power supplied to CPU 220-2.

The total cost of an electronic system is largely determined by the components (ICs) that make up the system. Generally speaking, when the function of a discrete component in a system can be performed by other components in a system, then the overall cost of the system can be reduced by eliminating that component. For example, most of the cost of system 200 (FIG. 3) is determined by the individual costs of PLD 100, PCD 210, SRAM 220-1, and CPU 220-2. If the function of PCD 210 can be performed by PLD 100, then elimination of PCD 210 typically would significantly reduce the cost of system 200.

A problem with eliminating PCD 210 from system 200 is that power control requires the use of a high current transistor, such as high current transistor 215 (shown in FIG. 4). That is, CMOS switch 123-2 of IOB 120 typically lacks the capacity to provide a high current (e.g., 200 milliamperes) that is typically required to power an IC. Further, simply increasing the size of CMOS switch 123-2 to provide this current capacity is undesirable because: a) not all devices connected to each IOB require (or can handle) a high current signal; b) the amount of space needed to produce a CMOS switch of this size would take up valuable chip area; and c) such a modification would produce additional capacitance and a slower slew rate.

Accordingly, what is needed is a power control output circuit for use in the IOBs of a PLD that can be selectively activated to generate a high current output signal sufficient to drive an IC device. What is also needed is a PLD having one or more IOBs incorporating such a power control output circuit.

SUMMARY OF THE INVENTION

The present invention is directed to a power control output circuit for a PLD that allows the PLD to selectively operate in either a low current ("normal") output mode, or a high current power control mode. In one embodiment, the power control output circuit is incorporated into one or more Power Control Input/Output Blocks (PC-IOB) provided on the PLD. In the low current output mode, the high current output circuit is deactivated, and the PC-IOB operates essentially the same as a conventional IOB (e.g., relatively low current output signals are transmitted to a device I/O terminal using a conventional CMOS switch). In the high current power control mode, the high current output circuit turns on a high current transistor in response to data output signals, thereby generating high current power control output signals at the device I/O terminal. This high current power control output signal can be supplied to the power (VCC) terminal of an IC device included in the system incorporating the PLD.

In accordance with an embodiment of the present invention, a power control output circuit includes an output driver that generates relatively low current output signals on a device terminal during "normal" (low current) operating modes, and a high current output circuit that generates relatively high current output signals on a device terminal during power control operating modes. The output driver includes a buffer having an input terminal connected to receive data output signals, and an output terminal connected to the input terminal of a CMOS switch, which has an output terminal connected to the device I/O terminal. The high current output circuit includes a high current (power control) transistor and a switch (e.g., a multiplexer). The high current transistor is connected between a high voltage source (VCCIO) and the device I/O terminal, and is controlled by a signal passed from the output driver by the switch. In one A marked-up copy of the specification is provided herewith in the attached appendix. embodiment, the high current transistor is a p-channel transistor, and the; multiplexer having a first input terminal connected to the high voltage source, a second input terminal connected to receive the buffered output signal generated by the buffer, and an output terminal connected to the gate terminal of the power control transistor. In another embodiment, the high current transistor is an n-channel transistor, and one input terminal of the multiplexer is connected to a low voltage source (e.g., VSS or ground), a second input terminal connected to the output driver, and the multiplexer output terminal is connected to the gate terminal of the power control transistor. A select terminal of the multiplexer in each embodiment is controlled in accordance with a desired operating mode. During the "normal" (i.e., low current) operating mode, the multiplexer maintains the power control transistor in a turned-off (non-conducting) state such that only the low current output signal from the output driver is transmitted to the device I/O terminal. During the power control mode, the multiplexer passes a data output signal from the output driver to the gate terminal of the power control transistor, thereby selectively turning on the power control transistor each time the data output signal is logic "0" (or "1") Accordingly, a high current (power control) output signal is selectively generated at the device I/O terminal that can be used to power selected IC devices of a system without requiring a discrete power control device, thereby reducing the total cost of the system.

In another embodiment of the present invention, a programmable logic device (PLD) includes one or more power control IOBs (PC-IOBs), a configuration memory array, and programmable logic circuitry for implementing a system logic operation in accordance with configuration data stored in the configuration memory array. Each PC-IOB including the power control output circuit (described above) in which the switch (e.g., the select terminal of the two-input multiplexer) is controlled using a power control configuration memory cell of the configuration memory array. Accordingly, during "normal" operations (i.e., when power control functions are not desired), a user programs the power control configuration memory cells to maintain the power control transistors of the one or more PC-IOBs in a turned-off (non-conducting) state-such that only low current output signals are generated at the device I/O terminals. Conversely, when power control is desired, a user programs a portion of the programmable logic circuitry to perform the desired power control function such that a power control signal is routed to the one or more PC-IOBs, and programs the power control configuration memory cell to connect the output driver of the PC-IOB to the gate terminal of the power control transistor. Subsequently, when a power control data output signal is generated by the portion of the programmable logic circuitry performing the power control function, the power control transistor is turned on to generate a high current output signal at the device terminal. Accordingly, a PLD incorporating one or more power control output circuits in accordance with the present invention reduces system costs by providing power control functions without increasing the number of discrete components needed to produce the system.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is directed to power control output circuits for use in Programmable Logic Device (PLDs), and to PLDs incorporating such power control output circuits. The present invention is also directed to systems incorporating such PLDS. While the present invention is described below with particular reference to Complex Programmable Logic Device (CPLDs) similar to those of the XC9500 family of devices produced by Xilinx, Inc. of San Jose, Calif., the present invention may be beneficially utilized in any PLD device, including Field Programmable Gate Arrays (FPGAs).

Figure 5:
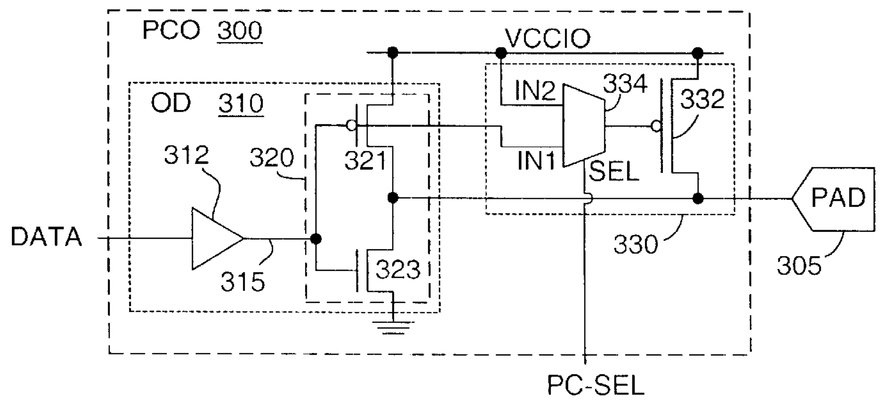
FIG. 5 is a circuit diagram showing a power control output circuit according to a first embodiment of the present invention.

FIG. 5 is a circuit diagram showing a power control output device 300 in accordance with an embodiment of the present invention. Power control output device 300 includes an output driver (OD) 310 for generating a relatively low current output signal on an integrated circuit (IC) device terminal (PAD) 305, and a high current output circuit 330 for selectively generating a relatively high current power control signal on IC device terminal 305.

Output driver 310 includes a buffer 312 and a CMOS switch 320. Buffer 312 has a data input terminal that receives a data output signal DATA, and an output terminal 315 that passes data output signal DATA to an input terminal of CMOS switch 320 (and to high current output circuit 330, as described below). CMOS switch 320 includes a p-channel transistor 321 that is connected between a high voltage source VCCIO and IC device terminal 305, and an n-channel transistor 323 that is connected between IC device terminal 305 and ground. The gate terminals of both p-channel transistor 321 and n-channel transistor 323 are connected to output terminal 315 of buffer 312. When data output signal DATA is high, p-channel transistor 321 is turned off and n-channel transistor 323 is turned on, thereby applying a low voltage (ground) signal on IC device terminal 305. Conversely, when data output signal DATA is low, p-channel transistor 321 is turned on and n-channel transistor 323 is turned off, thereby passing a low current, high voltage (VCCIO) signal to IC device terminal 305.

High current output circuit 330 includes a power control (high current) transistor 332, and a two-input multiplexer (switch) 334. Power control transistor 332 is fabricated using known techniques to pass a relatively high current (e.g., 200 milliamperes, as compared with approximately 5 milliamperes passed by p-channel transistor 321). As is known in the art, this high current requirement is produced, for example, by forming power control transistor with a wider channel than that of p-channel transistor 321 (which in the disclosed embodiment is incorporated into CMOS switch 320, but can be a discrete transistor structure). Multiplexer 334 includes a first input terminal IN1 connected to output terminal 315 of buffer 312, a second input terminal IN2 connected to VCCIO, an output terminal connected to the gate terminal of power control transistor 332, and a select terminal SEL that is controlled by a power control select signal PC-SEL. Power control select signal PC-SEL is received from, for example, a configuration memory cell provided on a PLD incorporating power control output circuit 300. In another embodiment, power control select signal PC-SEL can be generated by the IC incorporating power control output circuit 300, or can be received by the IC from an external source.

High current output circuit 330 is disabled during "normal" (low current) operating modes by a first (e.g., logic "0") signal PC-SEL, and is enabled during power control (high current) operating modes by a second (e.g., logic "1") signal PC-SEL. During "normal" operating modes, the first (e.g., logic "0") signal PC-SEL causes multiplexer 334 to pass VCCIO to the gate terminal of high current transistor 332, thereby maintaining high current transistor 332 in a non-conducting (turned off) state. Accordingly, data output signals DATA that are passed through buffer 312 and CMOS switch 320 are generated on IC device terminal 305 as relatively low current signals. In contrast, during power control operations, the second (e.g., logic "1") control signal PC-SEL causes multiplexer 334 to couple the gate terminal of high current transistor 332 to output terminal 315 of buffer 312. In this operating state, when buffer 312 generates a low voltage output signal, high current transistor 332 is turned on (along with low current p-channel transistor 321 of CMOS switch 330), thereby generating a high current VCCIO signal on IC device terminal 305. Note that, even in the high current operating mode, when buffer 312 generates a high voltage output signal, high current transistor 332 is turned off, and IC device terminal 305 is pulled to ground through n-channel transistor 323 of CMOS switch 320.

Several alternatives to the embodiment described above are possible without changing the spirit and scope of the present invention. For example, high current transistor 332 is implemented in the disclosed embodiment as a p-channel transistor, and second input terminal IN2 of multiplexer 334 is tied to VCCIO such that power control transistor 332 maintained in a non-conducting state in the normal (low current) operating mode. In an alternative embodiment, a similar function can be performed using an n-channel transistor in place of p-channel power control transistor 332, and connecting second input terminal IN2 to ground instead of to VCCIO. In yet another alternative embodiment, two-input multiplexer 334 can be replaced with an equivalent switch or logic circuit in accordance with known circuit design techniques. Similarly, in yet another alternative embodiment, a function similar to that performed by buffer 312 can be implemented using a logic gate or other buffering structure.

Figure 6:
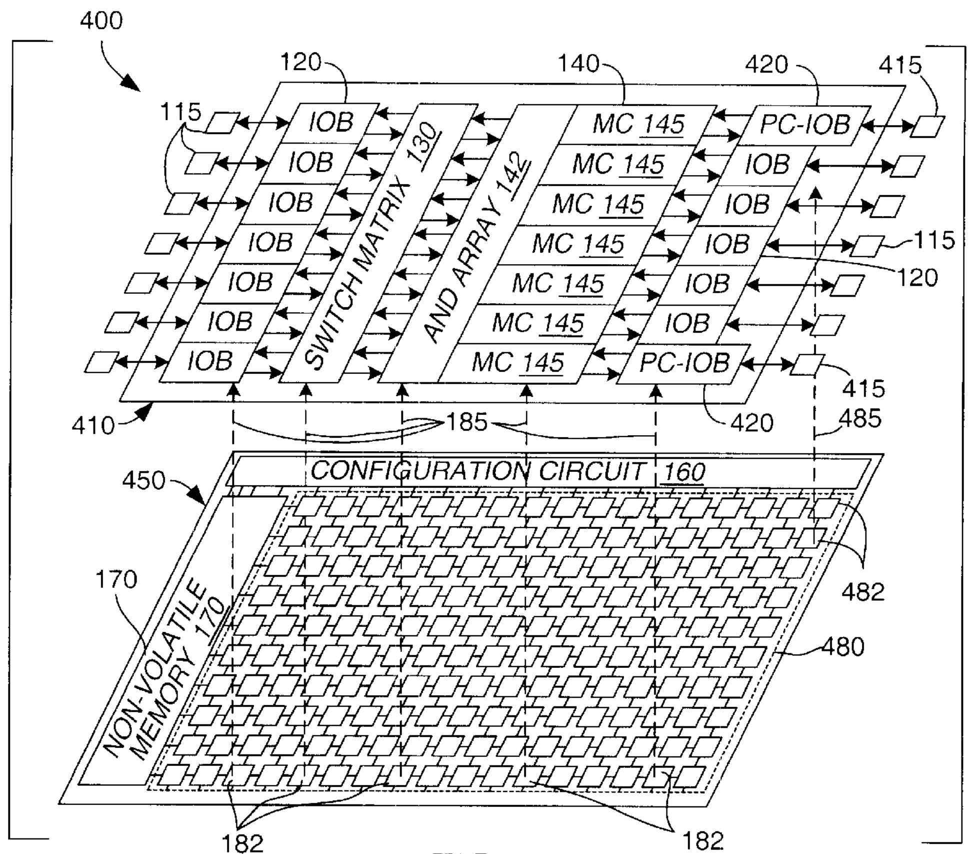
FIG. 6 is a split-level perspective view showing a CPLD in accordance with a second embodiment of the present invention.

FIG. 6 is a split-level perspective diagram of a CPLD 400 in accordance with a second embodiment of the present invention. Similar to conventional CPLD 100 (see FIG. 1), CPLD 400 is functionally separated into a logic plane 410, which includes the programmable logic resources (circuitry) used to implement selected logic operations, and a configuration plane 450 that includes the configuration memory circuits used to store the configuration data utilized to control the programmable logic resources of logic plane 410. Resources of CPLD 400 that are essentially identical to those described above with reference to conventional PLD 100 are identified with like reference numbers, and description of these resources is omitted for brevity. Other simplifications and functional representations are utilized to facilitate the following description.

Referring to the upper portion of FIG. 6, logic plane 410 of CPLD 400 includes I/O terminals 115, IOBs 120, interconnect switch matrix 130, and function block (FB) 140, which are described above with reference to CPLD 100. In addition, and in accordance with the present invention, logic plane 410 includes one or more power control IOBs (PC-IOBs) 420. Each PC-IOB 420 is connected between the programmable logic circuitry provided in PB 140 and an associated device I/O terminal 415. In the present embodiment, each PC-IOB 420 receives data output signals from an associated macrocell (MC) 145 that is identical to all other MCs 145 of FB 140. In an alternative embodiment, the macrocell connected to each PC-IOB 420 may include different programmable logic circuitry.

Referring to the lower portion of FIG. 6, configuration plane 450 generally includes configuration circuit 160, a non-volatile memory array 170, and a volatile memory array 480. Configuration circuit 160 and non-volatile (e.g., flash) memory array 170 function as described above with reference to conventional CPLD 100.

Volatile memory array 480 includes volatile (e.g., SRAM) configuration memory cells 182 arranged in rows and columns that temporarily store configuration data (e.g., until power to CPLD 400 is terminated). In addition to configuration memory cells 182, volatile memory array 480 includes one or more power control memory cells 482 for storing configuration data used to control the one or more PC-IOBs 420 via connections 485 (indicated by dashed lines with arrows). Similar to CPLD 100, during "normal" operations of CPLD 400, disabling configuration data is stored in power control memory cells 482, and the configuration data stored in configuration memory cells 182 is used to control associated IOBs 120, switch matrix 130, and FBs 140 in a manner understood by those of ordinary skill in the art, thereby causing CPLD 400 to implement the logic operations defined by the configuration data.

Figure 7:
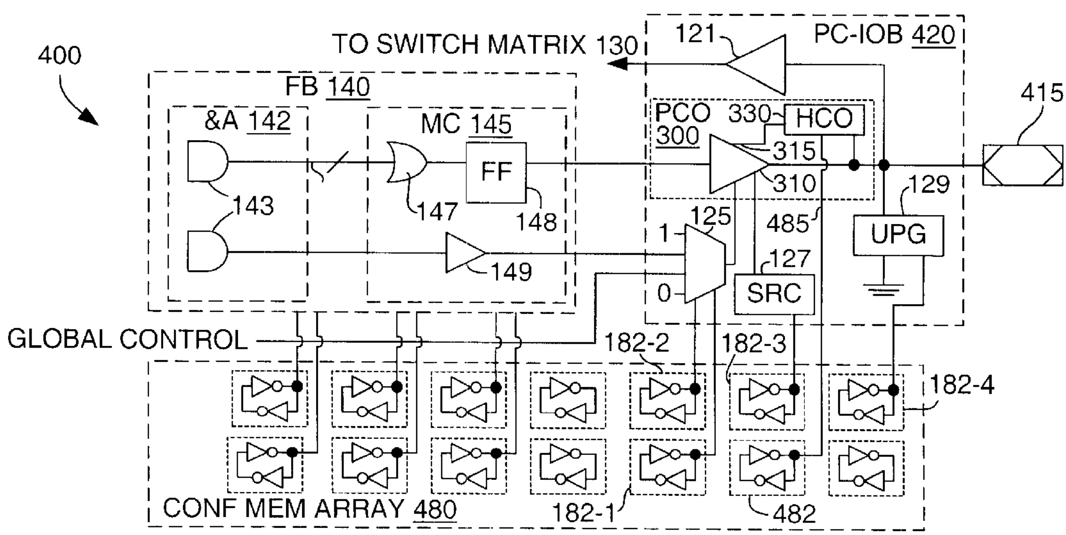
FIG. 7 is a simplified circuit diagram showing a portion of the CPLD shown in FIG. 6.

FIG. 7 is a simplified circuit diagram showing portions of CPLD 400 in additional detail. In particular, FIG. 7 shows a simplified representation of FB 140, PC-IOB 420, and configuration memory array (CONF MEM ARRAY) 480.

Figure 1:
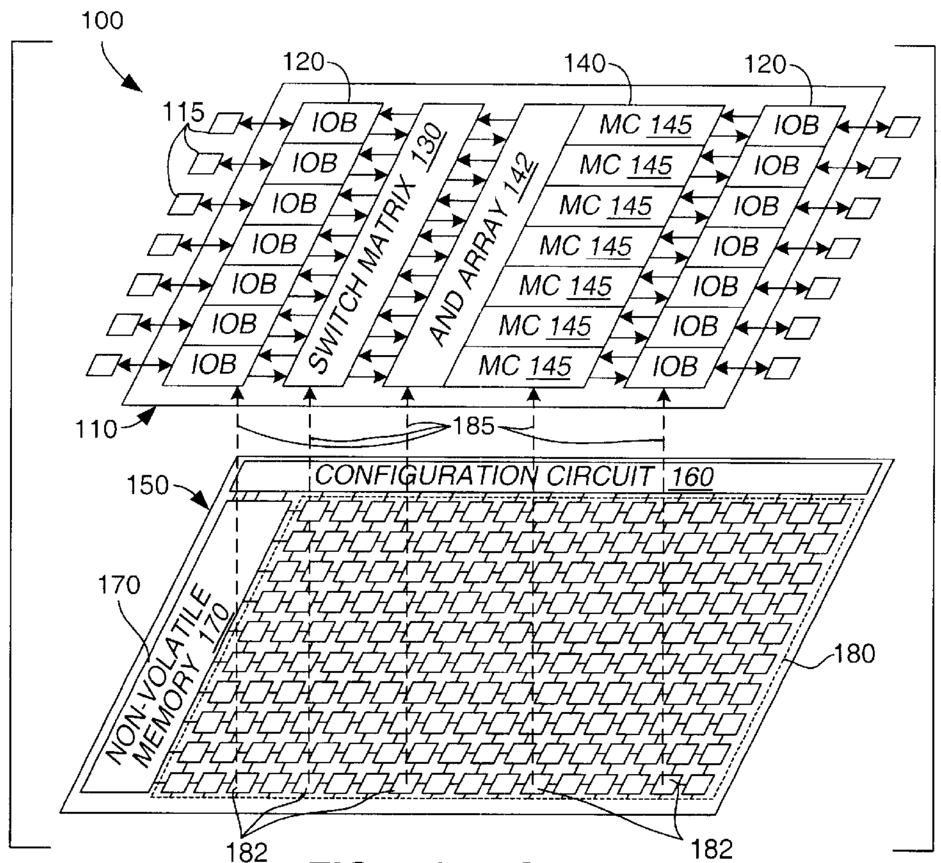
FIG. 1 is a split-level perspective view showing a conventional CPLD.
Figure 2:
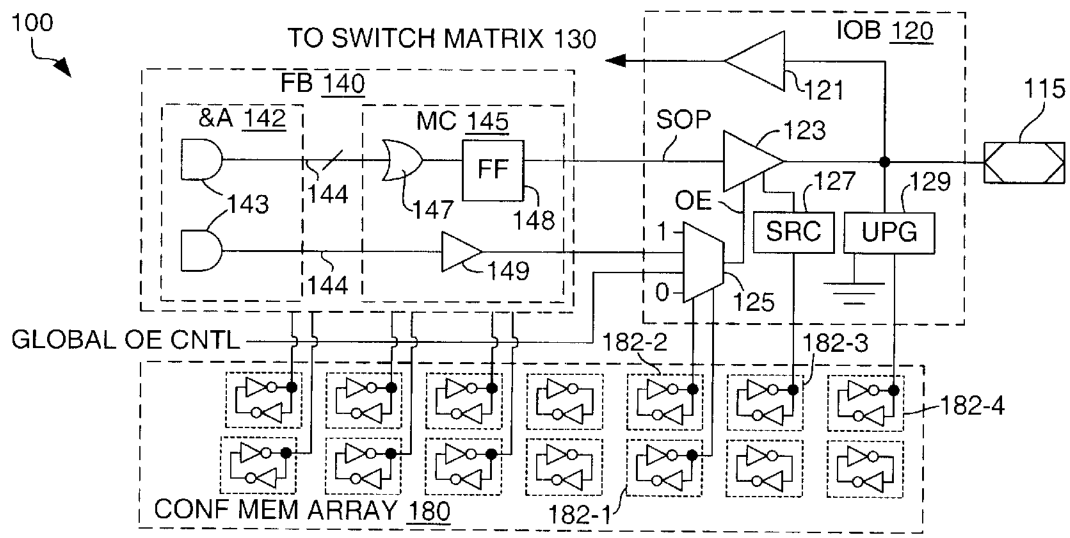
FIG. 2 is a simplified circuit diagram showing a portion of the conventional CPLD shown in FIG. 1.

Referring to the upper left portion of FIG. 7, in the present embodiment FB 140 includes programmable logic circuitry that is essentially identical to that provided in conventional CPLD 100 (shown in FIG. 1). In particular, FB 140 includes logic AND array (&A) 142, which is depicted as logic AND gates 143, and a portion of a macrocell 145 depicted as including a logic OR gate 147, a flip-flop (FF) 148, and an output enable (OE) buffer 149. When PC-IOB 420 is utilized in the "normal" (low current) output mode, FB 140 is selectively programmed by configuration data stored in configuration memory array 480 to perform a selected portion of a user's logic function. In contrast, as described in additional detail below, when PC-IOB 420 is utilized in the power control output mode, FB 140 is programmed to implement a power control function for controlling an IC device connected to device I/O terminal 415.

Referring to the upper right portion of FIG. 7, PC-IOB 420 includes an input buffer 121, an output enable (OE) multiplexer 125, a slew-rate control (SRC) circuit 127, and a user-programmable ground (UPG) circuit 129 that are essentially identical to those utilized in conventional CPLD 100 (described above). In addition, PC-IOB 420 includes power control output (PCO) circuit 300, which is described above with reference to FIG. 5. In particular, PCO circuit 300 includes output driver circuit 310 and high current output (HCO) circuit 330. Output driver circuit 310 receives a data output signal from MC 145 and an output enable signal from OE multiplexer 125. The buffered data signal transmitted from output terminal 315 of buffer 312 (see FIG. 5) is transmitted to HCO circuit 330, and the output signal from CMOS switch 320 (see FIG. 5) is transmitted to device I/O terminal 415. HCO circuit 330 receives the buffered data signal from output driver circuit 310, and a power control select signal from power control configuration memory cell 482 of configuration memory array 480, and selectively generates a high current output signal on device I/O terminal 415. Other circuitry of IOB 120 and associated connections to configuration memory array 180 are omitted for brevity.

Figure 8:
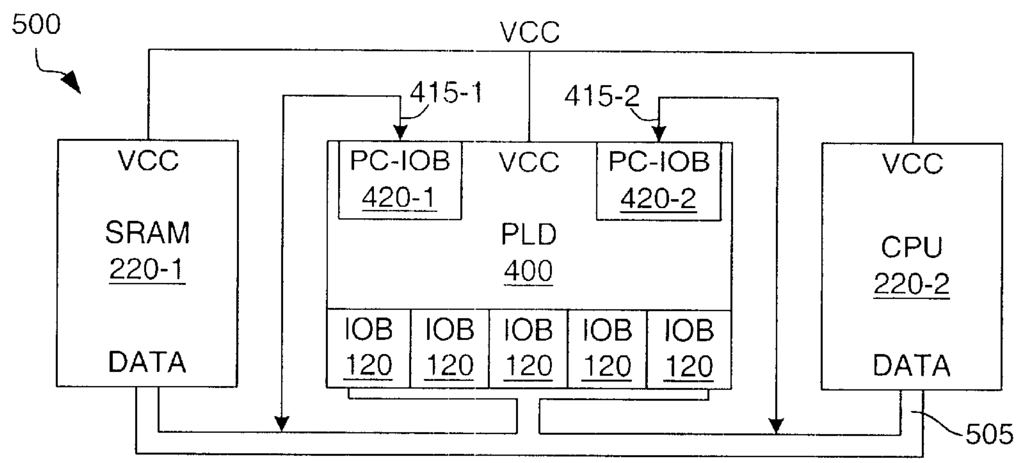
FIG. 8 is a block diagram showing a system incorporating the CPLD of FIG. 6 in a "normal" operating mode.
Figure 9:
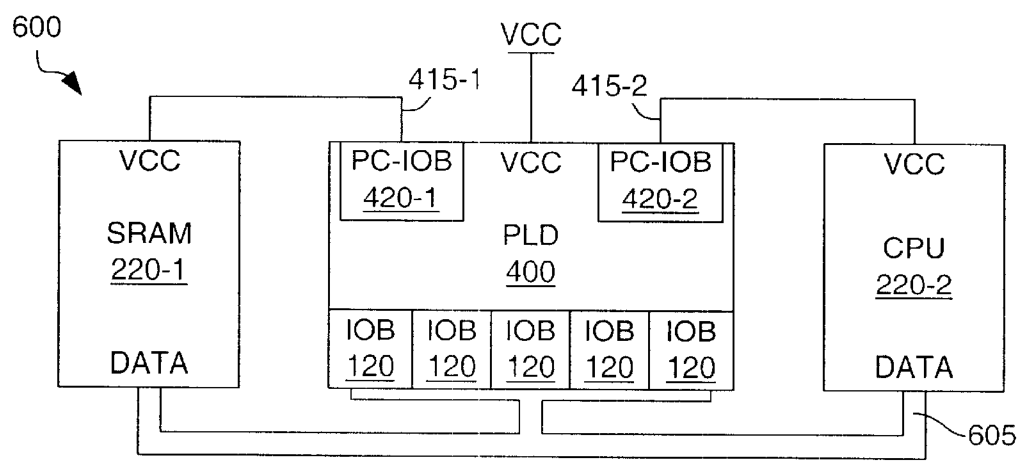
FIG. 9 is a block diagram showing a system incorporating the CPLD of FIG. 6 in a power control operating mode.

FIGS. 8 and 9 are block diagrams illustrating how PLD 400 (described above) can be incorporated into electronic systems that either utilize or ignore the power control functions provided by PC-IOBs 420. Specifically, FIGS. 8 and 9 illustrate how PC-IOB 420 (described above) can be utilized in either a "normal" (low current) operating mode, or in a power control (high current) operating mode.

FIG. 8 is a block diagram showing a system 500 in which each PC-IOB of a PLD 400 is utilized in a "normal" (low current) operating mode. System 500 includes PLD 400, an SRAM 220-1, and a CPU 220-2. SRAM 220-1 has a power (VCC) terminal connected to a first PC-IOB 420-1 of PLD 400, and one or more data terminals connected to a bus 505. CPU 220-2 has a power (VCC) terminal connected to the external power source, and one or more data terminals connected to a bus 505. PLD includes several IOBs 120 and PC-IOBs 420-1 and 420-2 that are connected to bus 550. As described above, PC-IOBs 420-1 and 420-2 can be programmed by power control configuration memory bits 482 (see FIG. 7) to generate low current output signals at device I/O terminals 415-1 and 415-2, respectively. This allows a maximum amount of the programmable logic circuitry of PLD 400 to be utilized to implement a user's logic function in the "normal" operating mode. Accordingly, PLD 400 can be utilized as a conventional PLD (i.e., a PLD that does not include the power control capabilities described herein) in the manner shown in FIG. 8.

FIG. 9 is a block diagram showing a system 600 incorporating PLD 400 in a power control operating mode in which PLD 400 is utilized to control the flow of power to SRAM 220-1 and CPU 220-2. SRAM 220-1 has a power (VCC) terminal connected to a first PC-IOB 420-1 of PLD 400, and one or more data terminals connected to a bus 605. CPU 220-2 has a power (VCC) terminal connected to a second PC-IOB 420-2 of PLD 400, and one or more data terminals connected to a bus 605. In addition to PC-IOBs 420-1 and 420-2, PLD 400 includes several IOBs 120 that are also connected to bus 605, and a power terminal (VCC) that is connected to an external voltage source VCC. To implement the power control operating mode shown in FIG. 9, a first portion of the programmable logic circuitry of PLD 400 is configured to implement logic functions that receive and transmit data signals to/from bus 605 via IOBs 120, and a second portion is configured to implement power control functions that control the transmission of power to SRAM 220-1 and CPU 220-2 via PC-IOBs 420-1 and 420-2. In addition, power control configuration memory bits 482 (see FIG. 7) are programmed to cause PC-IOBs 420-1 and 420-2 to generate high current output signals onto device I/O terminals 415-1 and 415-2, respectively.

Figure 3:
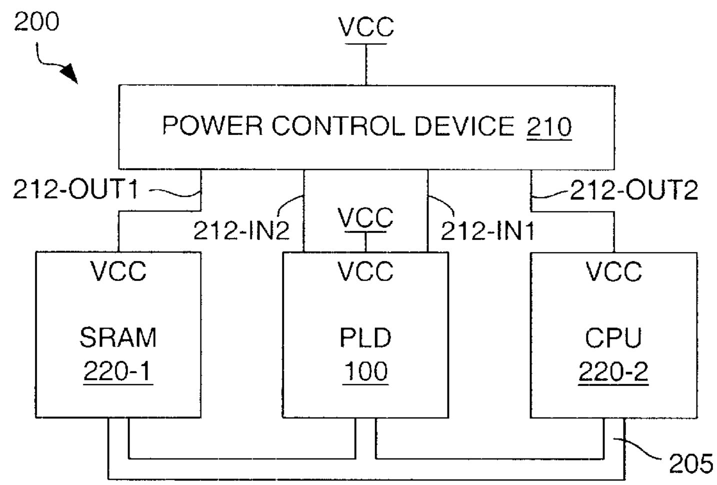
FIG. 3 is a block diagram showing a system using a conventional power control device.
Figure 4:
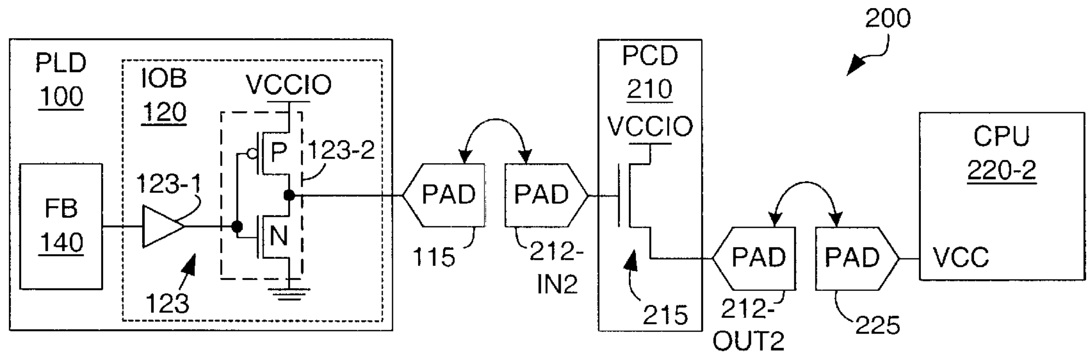
FIG. 4 is a simplified circuit diagram showing a portion of the system shown in FIG. 3.

Note that system 600 perform essentially the same power control function as that of prior art system 200, but does not include power control device 210 (see FIGS. 3 and 4). Further, the cost associated with incorporating one or more PC-IOBs 420 into PLD 400 is nominal. Accordingly, system 600 is relatively less expensive and requires less space than conventional system 200 because PLD 400 eliminates the need for discrete power control device 215, which is required in conventional system 200.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A circuit comprising:

an output driver for generating a first, relatively low current output signal on an integrated circuit (IC) device terminal in response to a data output signal; and a power control output circuit connected in parallel with the output driver and including:

a high current transistor, connected between a high voltage source and the IC device terminal, for generating a second, relatively high current output signal on the IC device terminal; and a switch, connected between the output driver and the high current transistor, said switch including a select terminal;

wherein, in a first operating mode, the switch maintains the high current transistor in a non-conducting state such that only the first output signal is transmitted to the IC device terminal by the output driver, wherein in a second operating mode, the switch causes the high current transistor to generate the second output signal at the IC device terminal in response to the data output signal, and wherein the first and second operating modes are selected by applying corresponding mode signals on the select terminal of the switch independent of a value of the data output signal.

2. The power control output circuit according to claim 1, wherein the output driver comprises a second transistor controlled by the data output signal, a first terminal connected to the high voltage source, and a second terminal connected to the IC device terminal, wherein a channel of the second transistor is narrower than a channel of the high current transistor.

3. The power control output circuit according to claim 1, wherein the output driver comprises:

a buffer for generating a logic output signal; and

CMOS switch including a p-channel transistor connected in series with an n-channel transistor between the high voltage source and ground, wherein a gate terminal of the n-channel transistor and a gate terminal of the p-channel transistor are connected to an output terminal of the buffer, and wherein the IC device terminal is connected to a node located between the p-channel transistor and the n-channel transistor.

4. The power control output circuit according to claim 1, wherein the high current transistor comprises a p-channel transistor, and wherein the switch comprises a multiplexer having a first input terminal connected to the high voltage source, a second input terminal connected to the output driver, and an output terminal connected to a gate terminal of the high current transistor.

5. The power control output circuit according to claim 1, wherein the high current transistor comprises an n-channel transistor, and wherein the switch comprises a multiplexer having a first input terminal connected to a low voltage source, a second input terminal connected to the output driver, and an output terminal connected to a gate terminal of the high current transistor.

6. A programmable logic device (PLD) comprising:

a configuration memory array including a plurality of configuration memory cells and a power control memory cell;

programmable logic circuitry for implementing a logic operation in accordance with configuration data stored by the configuration memory cells, and for generating a data output signal in accordance with the logic operation;

a device input/output (I/O) terminal; and a power control input/output block including:

an output driver for generating a first, relatively low current output signal on the device I/O terminal in response to the data output signal; and a power control output circuit connected in parallel with the output driver and including:

a high current transistor, connected between a high voltage source and the device I/O terminal, for generating a second, relatively high current output signal on the IC device terminal; and a switch connected between the output driver and the high current transistor, wherein the switch has a control terminal connected to the power control memory cell of the configuration memory array for controlling a value applied to the control terminal independent of a value of the data output signal.

7. The PLD according to claim 6, wherein the output driver comprises a second transistor controlled by the data output signal, a first terminal connected to the high voltage source, and a second terminal connected to the device I/O terminal, wherein a channel of the second transistor is narrower than a channel of the high current transistor.

8. The PLD according to claim 6, wherein the output driver comprises:

a buffer for receiving the data output signal from the programmable logic circuitry and for generating a logic output signal; and CMOS switch including a p-channel transistor connected in series with an n-channel transistor between the high voltage source and ground, wherein a gate terminal of the n-channel transistor and a gate terminal of the p-channel transistor are connected to an output terminal of the buffer, and wherein the device I/O terminal is connected to a node located between the p-channel transistor and the n-channel transistor.

9. The PLD according to claim 6, wherein the high current transistor comprises a p-channel transistor, and wherein the switch comprises a multiplexer having a first input terminal connected to the high voltage source, a second input terminal connected to the output driver, an output terminal connected to a gate terminal of the high current transistor, and a select terminal connected to the power control memory cell of the configuration memory array.

10. The PLD according to claim 6, wherein the high current transistor comprises an n-channel transistor, and wherein the switch comprises a multiplexer having a first input terminal connected to a low voltage source, a second input terminal connected to the output driver, an output terminal connected to a gate terminal of the high current transistor, and a select terminal connected to the power control memory cell of the configuration memory array.

11. The PLD according to claim 6, wherein the high current transistor comprises a p-channel transistor, wherein the switch comprises a multiplexer having a second input terminal connected to the high voltage source, wherein when the power control memory cell stores a first data value, the switch passes the output signal to the gate terminal of the high current transistor, thereby turning on the high current transistor each time the data output signal is in a first state, and wherein when the power control memory cell stores a second data value, the switch connects the voltage source to the gate terminal of the high current transistor, thereby maintaining the high current transistor in a non-conducting state.

12. The PLD according to claim 6, wherein the high current transistor comprises an n-channel transistor, wherein the switch comprises a multiplexer having a second input terminal connected to a low voltage source, wherein when the power control memory cell stores a first data value, the switch passes the output signal to the gate terminal of the high current transistor, thereby turning on the high current transistor each time the output signal is in a first state, and wherein when the power control memory cell stores a second data value, the switch connects the low voltage source to the gate terminal of the high current transistor, thereby turning off the high current transistor.

13. An electronic system comprising:

an integrated circuit (IC) device having a power terminal; and a programmable logic device (PLD) including:

a configuration memory array including a plurality of configuration memory cells and a power control memory cell;

programmable logic circuitry for implementing a logic operation in accordance with configuration data stored by the configuration memory cells, and for generating a data output signal in accordance with the logic operation;

a device terminal; and a power control input/output block including:

an output driver for generating a first relatively low current output signal on the device I/O terminal in response to the data output signal; and a power control output circuit connected in parallel with the output driver and including:

a high current transistor connected between a high voltage source and the device I/O terminal for generating a second relatively high current output signal on the device I/O terminal; and a switch connected between the output driver and the high current transistor, wherein the switch has a control terminal connected to the power control memory cell of the configuration memory array for controlling a value applied to the control terminal independent of a value of the data output signal.

14. The electronic system according to claim 13, wherein the IC device further includes a data terminal, and wherein the PLD further comprises:

a second device terminal connected to the data terminal of the IC device; and an input/output block including an output driver for generating a third relatively low current output signal on the device terminal.

15. The electronic system according to claim 13, wherein the output driver of the PLD comprises a second transistor controlled by the data output signal, a first terminal connected to the high voltage source, and a second terminal connected to the device I/O terminal, wherein a channel of the second transistor is narrower than a channel of the high current transistor.

16. The electronic system according to claim 13, wherein the output driver of the PLD comprises:

a buffer for receiving the data output signal from the programmable logic circuitry and for generating a logic output signal; and CMOS switch including a p-channel transistor connected in series with an n-channel transistor between the high voltage in source and ground, wherein a gate terminal of the n-channel transistor and a gate terminal of the p-channel transistor are connected to an output terminal of the buffer, and wherein the device I/O terminal is connected to a node located between the p-channel transistor and the n-channel transistor.

17. The electronic system according claim 13, wherein the high current transistor of the PLD comprises a p-channel transistor, and wherein the switch of the PLD comprises a multiplexer having a first input terminal connected to the high voltage source, a second input terminal connected to the output driver, an output terminal connected to a gate terminal of the configuration memory array.

18. The electronic system according to claim 13, wherein the high current transistor of the PLD comprises an n-channel transistor, and wherein the switch of the PLD comprises a multiplexer having a first input terminal connected to a low voltage source, a second input terminal connected to the output driver, an output terminal connected to a gate terminal of the high current transistor, and a select terminal connected to the power control memory cell of the configuration memory array.

19. The electronic system according to claim 13, wherein the high current transistor of the PLD comprises a p-channel transistor, wherein the switch of the PLD comprises a multiplexer having a second input terminal connected to the high voltage source, wherein when the power control memory cell stores a first data value, the switch passes the output signal to the gate terminal of the high current transistor, thereby turning on the high current transistor each time the data output signal is in a first state, and wherein when the power control memory cell stores a second data value, the switch connects the voltage source to the gate terminal of the high current transistor, thereby maintaining the high current transistor in a non-conducting state.

20. The electronic system according to claim 13, wherein the high current transistor of the PLD comprises an n-channel transistor, wherein the switch of the PLD comprises a multiplexer having a second input terminal connected to a low voltage source, wherein when the power control memory cell stores a first data value, the switch passes the output signal to the gate terminal of the high current transistor, thereby turning on the high current transistor each time the output signal is in a first state, and wherein when the power control memory cell stores a second data value, the switch connects the low voltage source to the gate terminal of the high current transistor, thereby turning off the high current transistor.

* * * * *